United States Patent [19]

Hanes et al.

[11] 4,131,905
[45] Dec. 26, 1978

[54] LIGHT-TRIGGERED THYRISTOR AND PACKAGE THEREFORE

[75] Inventors: Maurice H. Hanes, Murrysville; Lewis R. Lowry, Greensburg, both of Pa.

[73] Assignee: Electric Power Research Institute, Inc., Palo Alto, Calif.

[21] Appl. No.: 800,706

[22] Filed: May 26, 1977

[51] Int. Cl.² ............... H01L 27/14; H01L 31/00; H01L 23/02
[52] U.S. Cl. ............................ 357/30; 357/17; 357/38; 357/74; 357/81
[58] Field of Search ............ 357/17, 30, 74, 81, 357/38

[56] References Cited

U.S. PATENT DOCUMENTS

| | | | |
|---|---|---|---|
| 3,423,594 | 1/1969 | Galopin | 357/30 |
| 3,586,932 | 6/1971 | Kokosa | 357/38 |
| 3,590,338 | 6/1971 | Roberts | 357/30 |
| 3,590,344 | 6/1971 | Roberts | 357/30 |
| 3,796,881 | 3/1974 | Roberts | 357/30 |
| 3,975,758 | 8/1976 | Schlegel | 357/74 |
| 3,991,460 | 11/1976 | Roberts | 357/30 |
| 4,003,074 | 1/1977 | Yonezu et al. | 357/74 |
| 4,008,486 | 2/1977 | Byczkowski | 357/74 |

Primary Examiner—Andrew J. James
Attorney, Agent, or Firm—Flehr, Hohbach, Test, Albritton & Herbert

[57] ABSTRACT

An hermetically sealed package for a light-triggered thyristor. The thyristor is mounted within the cavity of an insulating body. Cathode and anode pole pieces are mounted on opposite sides of and electrically coupled with the thyristor. Annular flanges are provided to form hermetical seals between the body and pole pieces. A light pipe is mounted in a radially extending slot formed through a face of one pole piece. An inner end of the light pipe is optically coupled with a light-sensitive region of the thyristor. The outer end of the light pipe is mounted within a metal sleeve which radially projects through an opening formed in a side of the body. A glass frit is bonded between the light pipe and inner end of the sleeve to form an hermetical seal. Another hermetical seal is formed by solder which bonds between the metal sleeve and a metalized region formed in the body about the opening. A connector fitting is mounted on an outer end of the sleeve for seating the end of a fiber optic cable which extends from a triggering light source.

12 Claims, 2 Drawing Figures

LIGHT-TRIGGERED THYRISTOR AND PACKAGE THEREFORE

BACKGROUND OF THE INVENTION

This invention relates in general to semiconductor devices and in particular relates to a package for thyristors of the type used in power circuits.

Thyristors are employed for various purposes in electrical power and control circuits. An example is the use of thyristors as high voltage distribution equipment. In such applications control problems arise due to factors such as noise signal pickup, also, high voltage potentials across the control leads used to trigger the thyristors must be avoided by expensive means such as individual transformers.

It would be desirable to employ a light-triggered thyristor in power circuits of the foregoing nature so as to isolate the control signal from the power signal and thereby eliminate noise pickup and control problems. However, it has heretofore not been feasible to employ light-triggered thyristors in power circuits because of the necessity for hermetically sealing such thyristors. The pole faces of power semiconductor devices require massive thermal and electrical contact to handle the relatively large currents, and it has not been feasible to introduce a triggering light signal to a light-sensitive region of one of these pole faces while maintaining hermeticity of the package. There is the further requirement of providing a suitable external connection between the package and the light source, such as a fiber optic cable. Previously the differences in coefficients of thermal expansion between glass light pipes and other elements of the package have precluded a practical hermetically sealed thyristor package for power circuits.

OBJECTS AND SUMMARY OF THE INVENTION

It is a general object of the invention to provide a new and improved package for light-triggered semiconductor devices of the type used in power circuits.

Another object is to provide a package of the type described which introduces a triggering light signal to a light-sensitive region of the semiconductor device while maintaining hermetical sealing of the package.

Another object is to provide an hermetically sealed package for a light-triggered thyristor for use in circuits where a control signal is to be electrically isolated from the power signal.

Another object is to provide a light-triggered thyristor package which preserves hermeticity of the package by providing hermetical seals at the opening through which the light pipe emerges from the package for coupling with a triggering light source.

The invention in summary includes an insulating body having a cavity in which a light-triggered semiconductor device is mounted. Cathode and anode pole pieces are mounted on opposite sides of the device, and hermetical seals are formed between the pole pieces and respective ends of the body. A light pipe is mounted within a radially extending slot formed in a face of one pole piece. An inner end of the light pipe is optically coupled with a light-sensitive region of the semiconductor device. The outer end of the light pipe carries a metal sleeve which extends through an opening formed in the body. The sleeve is formed of a material having a coefficient of thermal expansion compatible with that of the light pipe and with the body. An hermetical seal is formed between an inner end of the sleeve and the light pipe and another hermetical seal is formed between the outer surface of the sleeve and a metalized region of the body about the opening. A connector fitting is mounted on the outer end of the sleeve for holding the end of a fiber optic cable which is connected with a triggering light source.

The foregoing and additional objects and features of the invention will appear from the following description in which the preferred embodiments have been set forth in detail in conjunction with the accompanying drawings.

DESCRIPTION OF THE PREFERRED EMBODIMENTS

Figure 1:
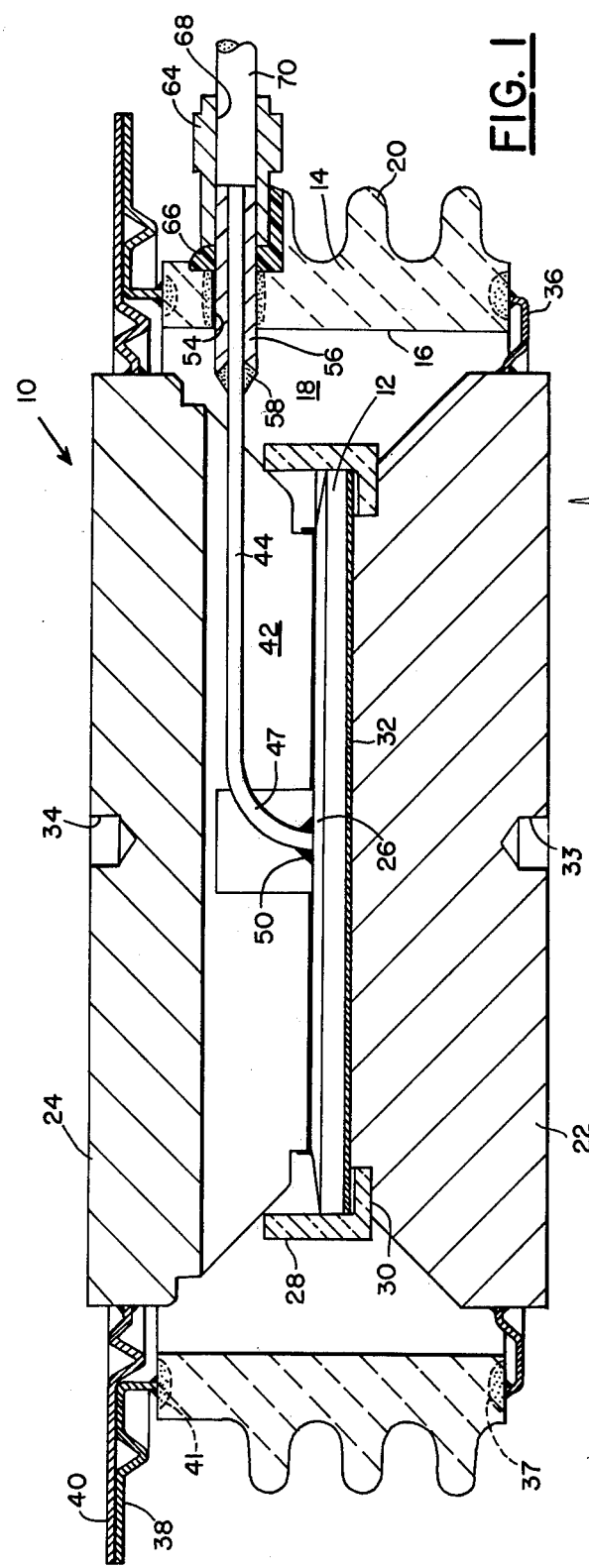
FIG. 1 is a cross-sectional view of a thyristor package according to the invention.
Figure 2:
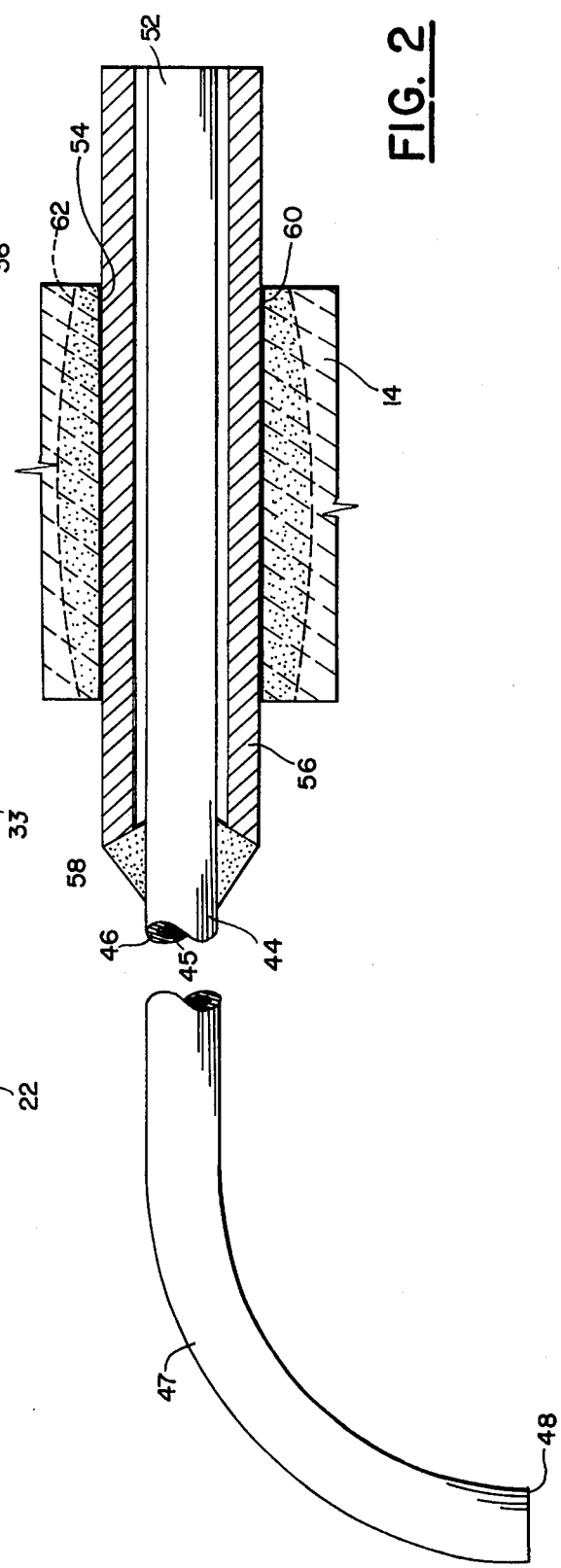
FIG. 2 is a fragmentary view to an enlarged scale of component elements of the package shown in FIG. 1.

In the drawings FIG. 1 illustrates an embodiment of the invention providing a package 10 for hermetically sealing a light-triggered semiconductor device 12, specifically a light-triggered thyristor. The thyristor package of the illustrated embodiment is specially adapted for use in circuits where it is desired to electrically isolate the control signal from the power signal.

Package 10 includes an annular electrical insulating body 14 comprised of a suitable ceramic material, preferably a high alumina ceramic. The inner wall 16 of the body is cylindrical to define a cavity 18, and the outer wall is formed with circular ribs 20 for increasing the surface resistance path, as is well known. A suitable inert gas such as nitrogen is filled within cavity 18 when the package is assembled and hermetically sealed in the manner described below.

Thyristor 12 is positioned within the body between a pair of pole pieces 22, 24. The pole pieces preferably are of nickel-plated copper and they provide the anode and cathode contacts. The thyristor comprises a silicon wafer having a light-sensitive region 26 formed on its upper face. The thyristor is centered between the pole pieces by means of a locator ring 28. The ring is shaped with an intrusive flange 30 which seats in a circular groove formed about the upper face of the lower pole piece. A circular disc 32 formed of a suitable electrical conductive material such as silver is mounted between the thyristor and the upper face of pole piece 22. Holes 33, 34 are partially drilled into the outer faces of the pole pieces to provide seats for the positioning pins of suitable copper heat sinks, which are conventional and thus need not be shown.

Lower pole piece 22 is mounted within the lower end of body 14 by means of an annular cap 36 formed of a suitable metal such as copper. Hermetical seals are formed at the junctures between cap 36 and the lower pole piece 22 and between the cap and body 14 by brazing with a suitable material such as a silver-copper alloy. Prior to brazing, a region 37 of the ceramic body adjacent the cap is metalized to establish a bond with the brazing material. The metalization can be carried out by firing a Mo-Mn paste at high temperature on the desired region of the ceramic.

Upper pole piece 24 is mounted within the upper end of the body by means of a pair of flanges 38, 40 formed of a metal such as copper. Lower flange 38 is hermetically sealed to the body 14 by brazing with a suitable material such as a silver-copper alloy. Prior to brazing, a region 41 of the ceramic body adjacent the flange is metalized by the procedure explained above. Upper flange 40 is cold welded about the circumference of the lower flange, and the inner rim of the upper flange is bonded about pole piece 24 by brazing with a silver-copper alloy.

A narrow slot 42 is formed diametrically across the lower face of upper pole piece 24. A light pipe 44 is mounted within one side of this slot. The light pipe is formed of a glass rod 45 bonded within a concentric glass jacket 46. The inner end of the light pipe is shaped with a bight or arcuate portion 47 terminating at a flat end 48 which abuts the light-sensitive region of the thyristor at substantially a right angle. A suitable adhesive 50 such as clear epoxy is bonded between flat end 48 and the thyristor face for improving optical coupling and to hold the rod in proper position.

Outer end 52 of the light pipe extends radially through an opening 54 formed in a side of body 14. An elongate hollow sleeve 56 is mounted about the outer end of the light pipe concentrically within the opening. Sleeve 56 is formed of a material having a coefficient of thermal expansion compatible with the coefficients of thermal expansion of the glass light pipe and glass frit as well as the ceramic material forming the body. Preferably the sleeve is formed of KOVAR, a trademark of Westinghouse Electric Corporation for an iron-nickel-cobalt alloy, or it can be formed of Carpenter 426, a trademark of Carpenter Steel Co. for a 42% nickel-iron steel alloy. The KOVAR alloy has a coefficient of thermal expansion in the range of $4.6$–$5.2 \times 10^{-6}/°$ C., while the Carpenter 426 has a coefficient of $7.4 \times 10^{-6}/°$ C. These alloys are thus compatible with the preferred materials of the light pipe and body. For example, in a typical light pipe the inner glass rod has a coefficient of $9.1 \times 10^{-6}/°$ C. and the outer glass jacket has a coefficient of $5.15 \times 10^{-6}/°$ C. Also by way of example a high alumina ceramic suitable for the insulating body has a coefficient of thermal expansion of $7.8 \times 10^{-6}/°$ C.

An hermetical seal is formed between sleeve 56 and the light pipe 44 by fusing a glass frit 58 between the inner end of the sleeve and the glass jacket 46. Preferably the frit material is Corning #7583, a trademark of the Corning Glass Company for a soft glass which flows and bonds at a temperature less than 500° C.

An hermetical seal is also formed by solder material 60 bonded about the outer surface of the sleeve and the body opening 54. Preferably the outer surface of the sleeve is initially plated with a metal such as nickel. A region 62 of the ceramic material about the opening is also initially metalized by the procedure described above for metalizing the regions 37 and 41. The solder seal material 60 preferably is a lead-tin solder which bonds both with the metalized region of the ceramic and the nickel plating about the sleeve.

A connector fitting or ferrule 64 formed of a suitable rigid material such as metal or hard plastic is mounted about the outwardly projecting end of sleeve 56. A suitable adhesive material 66 such as epoxy is applied to bond the ferrule to the ceramic body and to the sleeve. The outer end of the ferrule extends beyond the end of light pipe 44 to provide a socket 68 for holding the end of a flexible fiber optic cable 70. The cable extends from a remote triggering light source, not shown.

The use and operation of the invention is as follows. The thyristor package 10 can be assembled and connected in a power circuit to provide an efficient transfer of an externally generated optical signal to the light sensitive region of the semiconductor device. At the same time the device is maintained in an hermetically sealed inert gas atmosphere and while also preserving a relatively large surface contact between the pole pieces and the device to prove good thermal conduction and to carry large currents. During fabrication of the package the step of hermetically sealing the package is completed by cold welding operation to be performed with existing equipment, components of which would otherwise interfere with the connector. Because an hermetical seal has already been established between the light pipe, sleeve and ceramic body, the adhesive bond holding the connector fitting need not be hermetic. The package is installed in the desired electrical circuit with the end of the fiber optic cable inserted in fitting 64. An optical signal from the remote source carries through the cable and along light pipe 44 for triggering the thyristor.

While the foregoing embodiments are at present considered to be preferred it is understood that numerous variations and modifications may be made therein by those skilled in the art and it is intended to cover in the appendant claims all such variations and modifications as fall within the true spirit and scope of the invention.

What is claimed is:

1. An hermetically sealed package for a light-triggered semiconductor device for use in power circuits, comprising the combination of an electrical insulating body formed of a ceramic material and having a central cavity, a light-triggered semiconductor device within the cavity, first and second pole pieces positioned within the opposite ends of the body and having respective inner pole faces juxtaposed with and electrically coupled in face-to-face relationahip to opposite sides of the semiconductor device for carrying substantial currents, means forming hermetical seals about the first and second pole pieces and respective ends of the body, means forming an opening in the body, a glass light pipe having an inner end optically coupled with a light-sensitive region of the semiconductor device and an outer end extending through the opening in the body, said outer end adapted to be optically coupled with a light source for triggering the device, a hollow metal sleeve mounted about a portion of the outer end of the light pipe, said sleeve also being mounted through the opening in the body, means for forming an hermetical seal between the light pipe and the sleeve, and means for forming an hermetical seal between the sleeve and the body.

2. A package as in claim 1 in which the light pipe has a right angle bight portion with the inner end coupled substantially perpendicular with said light-sensitive region and with the outer end extending radially through the body.

3. A package as in claim 2 in which said one pole piece is formed with a radially extending slot through its pole face, and the outer end of the light pipe extends along said slot.

4. A package as in claim 1 in which the insulating body is formed with a radially extending opening, said sleeve extends coaxially through the body opening, and said means forming the seal between the sleeve and body comprises solder material bonded between the sleeve and body portion which forms the opening.

5. A package as in claim 4 in which a portion of the ceramic material which forms said body opening is combined with molecules of a metal in an amount sufficient to form a metalized bond with said solder material, and the outer surface of the sleeve is comprised of a metal which bonds with said solder material.

6. A package as in claim 4 in which the light pipe is comprised of a light-transmissive glass material, and the sleeve is comprised of a metal having a coefficient of thermal expansion commensurate with the coefficient of thermal expansion of the material of the body and of the material of the light pipe.

7. A package as in claim 1 in which the means forming the seal between the light pipe and sleeve comprises an annulus formed of a glass frit material bonded between the outer surface of the light pipe and the inner end of the sleeve.

8. A package as in claim 7 which includes optically-clear adhesive means for forming a light-transmissive bond between the inner end of the light pipe and the light-sensitive region of the semiconductor device.

9. A package as in claim 1 which includes means for optically coupling the light pipe with the triggering light source comprising a ferrule having one end mounted about a portion of the sleeve which projects radially out from the body, the ferrule having another end forming a socket for holding an end of a fiber optic cable forming a part of said light source, together with adhesive means for bonding the ferrule to the body or to the sleeve.

10. An hermetically sealed thyristor package for use in power circuits including the combination of an annular electrical insulating body formed of a ceramic material and having a radially extending opening in a side thereof, a pair of electrical contacts coaxially mounted within the body in spaced-apart relationship, means forming hermetical seals between the contacts and respective ends of the body, a light-triggered thyristor mounted coaxially between and electrically coupled in face-to-face relationship with the contacts for carrying substantial currents, means forming a radially extending passageway through a side of one of the contacts, a glass light pipe having a radially directed outer end extending along the passageway and through the opening in the body, the light pipe having an arcuate inner end abutting a light-sensitive region of the thyristor, a metal sleeve mounted coaxially about the outer end of the light pipe, means forming an hermetical seal between the sleeve and the light pipe, means forming an hermetical seal between the sleeve and the body, a connector fitting mounted about a portion of the sleeve which projects outwardly from the body, said fitting having a socket-shaped end for mounting the end of a fiber optic cable coupled with a triggering light source.

11. A thyristor package as in claim 10 in which the means forming the seal between the sleeve and light pipe comprises glass frit material bonded between the inner end of the sleeve and the adjacent outer surface of the light pipe.

12. A thyristor package as in claim 11 in which the means forming the seal between the sleeve and body includes means forming a zone of metalized material in the body about the opening together with solder seal means in the opening for forming a bond with the metalized material and with the outer surface of the sleeve.

* * * * *